US007696811B2

(12) United States Patent
Barrows et al.

(10) Patent No.: US 7,696,811 B2
(45) Date of Patent: Apr. 13, 2010

(54) METHODS AND CIRCUITS TO REDUCE THRESHOLD VOLTAGE TOLERANCE AND SKEW IN MULTI-THRESHOLD VOLTAGE APPLICATIONS

(75) Inventors: Corey Kenneth Barrows, Colchester, VT (US); Douglas W. Kemerer, Essex Junction, VT (US); Stephen Gerard Shuma, Underhill, VT (US); Douglas Willard Stout, Milton, VT (US); Oscar Conrad Strohacker, Leander, TX (US); Mark Steven Styduhar, Hinesburg, VT (US); Paul Steven Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 11/941,342

(22) Filed: Nov. 16, 2007

(65) Prior Publication Data

US 2008/0086706 A1 Apr. 10, 2008

Related U.S. Application Data

(63) Continuation-in-part of application No. 11/424,961, filed on Jun. 19, 2006, now Pat. No. 7,459,958.

(51) Int. Cl.
*H03K 3/01* (2006.01)
(52) U.S. Cl. .................. 327/534; 327/535; 327/537; 327/565; 327/566
(58) Field of Classification Search ......... 327/534–535, 327/537, 561–566
See application file for complete search history.

(56) References Cited

U.S. PATENT DOCUMENTS

| 6,417,709 | B1 * | 7/2002 | Mizuhara ................. 327/175 |
| 6,462,623 | B1 * | 10/2002 | Horan et al. ............... 331/17 |
| 6,695,475 | B2 | 2/2004 | Yin |
| 7,119,525 | B1 | 10/2006 | Yoshino |
| 7,197,104 | B1 | 3/2007 | Cheung et al. |

(Continued)

OTHER PUBLICATIONS

Fet Modeling for Circuit Simulation by Dileep; pp. 73-76. Divekar; http://books.google.com/books?id=QdtbOnfOeEQC&pg=PP11&dq=5.9+threshold+voltage+shift&sig=bkHISy9OW5qq02vUPtwsn8HNplk#PPA75,M1.

(Continued)

*Primary Examiner*—Lincoln Donovan
*Assistant Examiner*—Brandon S Cole
(74) *Attorney, Agent, or Firm*—Schmeiser, Olsen & Watts; Riyon W. Harding

(57) ABSTRACT

A design structure. The design structure includes: a first set of FETs having a designed first Vt and a second set of FETs having a designed second Vt, the first Vt different from the second Vt; a first monitor circuit containing at least one FET of the first set of FETs and a second monitor circuit containing at least one FET of the second set of FETs; a compare circuit configured to generate a compare signal based on a performance measurement of the first monitor circuit and of the second monitor circuit; a control unit responsive to the compare signal and configured to generate a control signal regulator based on the compare signal; and an adjustable voltage regulator responsive to the control signal and configured to voltage bias wells of FETs of the second set of FETs, the value of the voltage bias applied based on the control signal.

16 Claims, 8 Drawing Sheets

U.S. PATENT DOCUMENTS

| | | | |
|---|---|---|---|
| 7,330,049 B2 | 2/2008 | Perisetty | |
| 7,459,958 B2 | 12/2008 | Barrows et al. | |
| 2001/0043101 A1* | 11/2001 | Ogawa et al. | 327/158 |
| 2005/0093619 A1* | 5/2005 | Naffziger et al. | 327/543 |
| 2005/0116765 A1* | 6/2005 | Sakiyama et al. | 327/534 |
| 2005/0210307 A1 | 9/2005 | Lee et al. | |
| 2006/0149983 A1 | 7/2006 | Kondou | |
| 2006/0170575 A1 | 8/2006 | Jang et al. | |
| 2007/0205802 A1* | 9/2007 | Perisetty | 326/27 |
| 2007/0228383 A1 | 10/2007 | Bernstein et al. | |
| 2008/0086706 A1 | 4/2008 | Barrows et al. | |

OTHER PUBLICATIONS

Office Action (Mail Date Feb. 20, 2009) for U.S. Appl. No. 12/138,514, filed Jun. 13, 2008; Confirmation No. 9555.

Office Action (Mail Date Apr. 15, 2009) for U.S. Appl. No. 12/169,705, filed Jul. 9, 2008; Confirmation No. 9783.

Office Action (Mail Date Jul. 1, 2009) for U.S. Appl. No. 12/138,514, filed Jun. 13, 2008; Confirmation No. 9555.

* cited by examiner

METHODS AND CIRCUITS TO REDUCE THRESHOLD VOLTAGE TOLERANCE AND SKEW IN MULTI-THRESHOLD VOLTAGE APPLICATIONS

RELATED APPLICATIONS

This application is a Continuation-in-part of U.S. patent application Ser. No. 11/424,961 filed on Jun. 19, 2006.

FIELD OF THE INVENTION

The present invention relates to the field of integrated circuits; more specifically, it relates to methods, circuits and design structures of circuits to reduce threshold voltage tolerance and skew in integrated circuits utilizing devices having multiple different threshold voltages.

BACKGROUND OF THE INVENTION

In order to reduce power consumption and increase performance, circuits having devices with different threshold voltages have been used in different portions of the integrated circuit. Devices with low threshold voltages are faster, but have greater sub-threshold voltage leakage (consume more power) compared with devices having high threshold voltages but low sub-threshold voltage leakage. Using a mix of high threshold voltage devices on non-performance critical circuit paths and low threshold voltage devices on performance critical circuit paths can result in lower overall power consumption and higher performance than using devices having the same threshold voltages.

However, it is critical that the designed relationship between the different threshold voltage values of different-threshold voltage devices be maintained in the fabricated integrated circuit in order to ease timing closure during design and avoid signal propagation timing issues. Therefore, there is a need for methods and circuits for maintaining the design values and/or relationships between the different threshold voltage values of multiple threshold voltage devices.

SUMMARY OF THE INVENTION

A aspect of the present invention is a design structure embodied in a machine readable medium for designing, manufacturing, or testing a design, the design structure comprising: a first set of field effect transistors (FETs) having a designed first threshold voltage and a second set of FETs having a designed second threshold voltage, the first threshold voltage different from the second threshold voltage; a first monitor circuit containing at least one FET of the first set of FETs and a second monitor circuit containing at least one FET of the second set of FETs; a compare circuit adapted to generate a compare signal based on a performance measurement of the first monitor circuit and a performance measurement of the second monitor circuit; a control unit responsive to the compare signal and configured to generate a control signal regulator based on the compare signal; and an adjustable voltage regulator responsive to the control signal and configured to supply a bias voltage to wells of FETs of the second set of FETs, the value of the bias voltage based on the control signal.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The performance of a field effect transistor (FET) is defined as the switching speed of the FET and the performance of a circuit is defined as the time delay of a signal propagated from an input to an output of the circuit.

Figure 1:
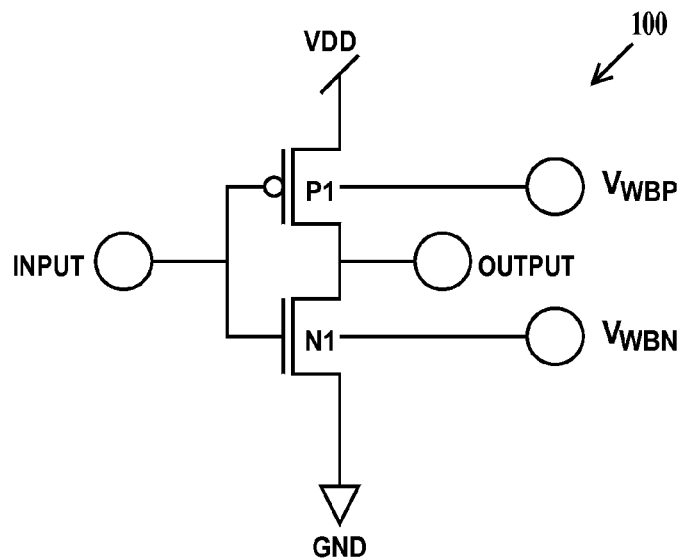
FIG. 1 is an exemplary circuit illustrating the principle for threshold voltage control according to the embodiments of the present invention.

FIG. 1 is an exemplary circuit illustrating the principle for threshold voltage control according to the embodiments of the present invention. In FIG. 1, an inverter 100 includes a P-channel field effect transistor (PFET) P1 and an N-channel field effect transistor (NFET) N1. The source of PFET P1 is connected to $V_{DD}$, the source of NFET N1 is connected to ground (or $V_{SS}$), the drains of PFET P1 and NFET N1 are connected to the output of the inverter and the gates of PFET P1 and NFET N1 are connected to the input of the inverter. PFET P1 is fabricated in an N-well and NFET N1 is fabricated in a P-well as is well known in the art. $V_{DD}$ is defined as the most positive voltage level of the power supply and ground (or $V_{SS}$) is defined as the most negative voltage level of the power supply.

Figure 2:
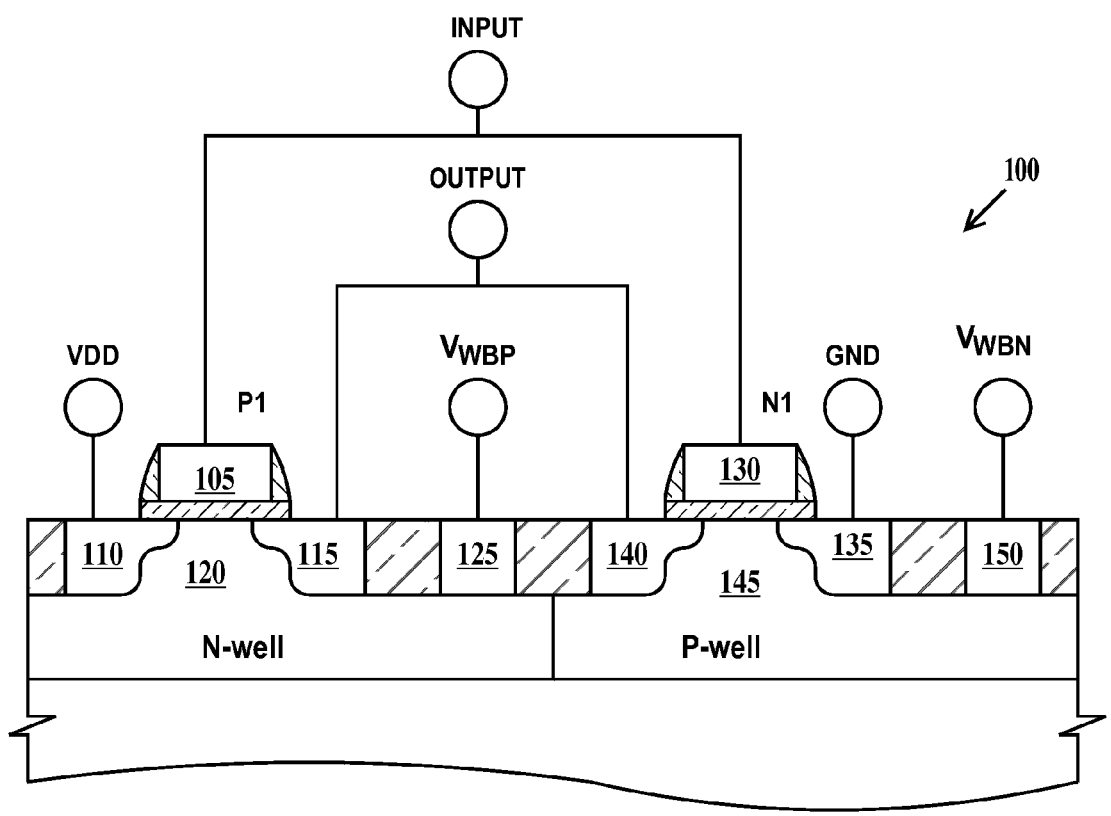
FIG. 2 is a cross-sectional view illustrating the physical structure of the inverter of FIG. 1.

FIG. 2 is a cross-sectional view illustrating the physical structure of the inverter of FIG. 1. PFET P1 includes a gate 105, a source 110, a drain 115, an N-well 120 and an N-well contact 125. NFET N1 includes a gate 130, a source 135, a drain 140, a P-well 145 and a P-well contact 150. The electrical connections described supra in reference to FIG. 1 are illustrated in FIG. 2. The crosshatched regions indicate dielectric material.

The threshold voltages ($V_t$s) of PFET P1 and NFET N1 are determined during fabrication and are a function of the various doping levels of the source/drains, channel region and gate electrode. The $V_t$s of PFET P1 and NFET N1 may be adjusted (after fabrication of the integrated circuit containing PFET P1 and NFET N1 is complete) by applying bias voltages $V_{WBP}$ and $V_{WBN}$ respectively to the N-well of PFET P1 and the P-well of NFET N1. Applying a positive (reverse) bias to the N-well of PFET P1 decreases its $V_t$ (makes its $V_t$ more negative) thus slowing down the PFET, while applying a negative (forward) bias to the N-well of PFET P1 increases its $V_t$ (makes its $V_t$ less negative) thus speeding up the PFET. Applying a positive (forward) bias to the P-well of NFET N1 decreases its $V_t$ (makes its $V_t$ less positive) thus speeding up the NFET, while applying a negative (reverse) bias to the P-well of NFET N1 increases its $V_t$ (makes its $V_t$ more positive) thus slowing down the NFET.

When integrated circuits having multiple $V_t$ FETs are designed, the $V_t$s of FETs are designed to be positive or negative fractions of $V_{DD}$. For example, a first FET may be designed to have a $V_t=V_{DD}/3$, a second FET may be designed to have a $V_t=V_{DD}/4$ and a third FET may be designed to have a $V_t=V_{DD}/5$. If $V_{DD}=1.0$ volt, then the $V_t$s are 0.33, 0.25 and 0.20 volts respectively. All other parameters being equal, a FET with a $V_t$ of 0.20 volt will be faster than FETs having $V_t$s of 0.25 volt and 0.33 volt. Further, the switching speeds of the different $V_t$ devices are designed to be ratios of each other. However, due to process variations, there is a +/− tolerance on the actual $V_t$ and therefore the switching speed obtained when the FETs are manufactured. This is called $V_t$ tolerance. Further, since each FETs $V_t$ is typically set during independent manufacturing steps, the tolerances of different FET types do not necessarily track. For example, a first $V_t$ FET could be manufactured faster than design while a second $V_t$ FET on the same integrated circuit chip could be manufactured slower than design. This is called $V_t$ skew. Table I illustrates this problem.

TABLE I

THRESHOLD VOLTAGES VERSUS SWITCHING SPEED

| Threshold Voltage in volts | Relative Switching Speed | Switching Speed Tolerance | Switching Speed Range |
|---|---|---|---|
| 0.20 | 0.75 | +/−0.15 | 0.90-0.60 |
| 0.25 | 1.00 | +/−0.15 | 1.15-0.85 |
| 0.30 | 1.25 | +/−0.15 | 1.40-1.10 |

In table I, the middle speed FET ($V_t=0.25$ volt) is the reference FET (Switching Speed=1.0). Thus, the actual switching speed of the fastest device ($V_t=0.20$ volt) can overlap the actual switching speed of the middle speed device ($V_t=0.25$ volt) and the actual switching speed of the middle speed device ($V_t=0.25$ volt) can overlap the actual switching speed of the slowest device ($V_t=0.30$ volt). This can complicate timing closure of the integrated circuit design because all combinations of $V_t$ skew and tolerance must be accounted for, or it could upset the timing of the circuit design if the switching speed ratios are assumed to be the designed values.

In a first embodiment of the present invention, the performance (switching speed) of the different $V_t$ devices is monitored. One $V_t$ device is chosen as a reference and the well bias of the other $V_t$ devices adjusted (which adjusts the $V_t$ which in turn adjusts the switching speed) until the design performance ratio (design switching speed ratio) of the other $V_t$ devices versus the reference $V_t$ device are brought to or near to design values. PFETs and NFETs are monitored and adjusted separately. This removes $V_t$ skew, but does not adjust for $V_t$ tolerance.

In a second embodiment of the present invention the performance (switching speed) of the different $V_t$ devices is monitored. The well bias of all different $V_t$ devices is adjusted (which adjusts the $V_t$ which in turn adjusts the switching speed) of the different $V_t$ devices until the design performance specification (design switching speed specification) of all the $V_t$ devices are brought to or near to design values. PFETs and NFETs are monitored and adjusted separately. This removes $V_t$ skew and adjusts for $V_t$ tolerance.

Figure 3A:
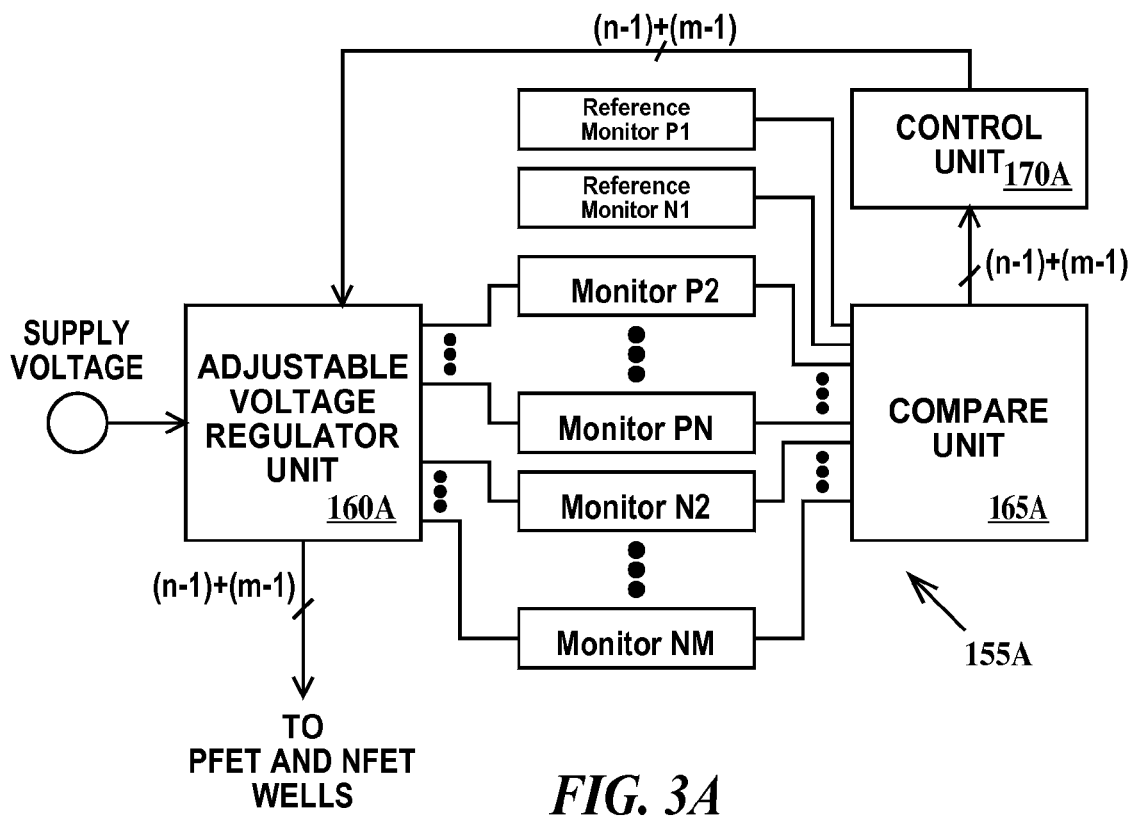
FIG. 3A is a schematic block circuit diagram of a circuit for threshold voltage control according to a first embodiment of the present invention.

FIG. 3A is a schematic block circuit diagram of a circuit for threshold voltage control according to a first embodiment of the present invention. In FIG. 3A, a threshold voltage adjustment circuit 155A includes an adjustable voltage regulator unit 160A, a set of PFET monitor circuits P1 through PN, a set of NFET monitor circuits N1 through NM, a compare unit 165A and a control unit 170A. In the example of FIG. 3A, reference monitor P1 monitors a reference PFET having a design $V_t$ of P1 and reference monitor N1 monitors a reference NFET having a design $V_t$ of N1. Adjustable voltage regulator unit 160A includes a separate N-well bias voltage regulator for each of the other different $V_t$ PFETs having respective design $V_t$s of P2 through PN and a different P-well bias voltage regulator for each of the other different $V_t$ NFETs having design $V_t$s of N2 through NM. Compare unit 165A includes a separate compare circuit for each different $V_t$ PFET ($V_t$s P2 through PN) and for each different $V_t$ NFET ($V_t$s N2 through NM) that compares the performance of the monitored FET to the performance of the reference FET. Adjustable voltage regulator unit 160A is coupled to a power supply (ultimately to an external power supply).

Each N-well and P-well bias voltage regulator generates a well bias voltage that is distributed throughout the integrated circuit chip to respective $V_t$ devices as well as to respective monitors P2 through PN. The output of each monitor P2 through PN is connected to a respective compare circuit within compare unit 165A as is the output of reference monitor P1. The output of each monitor N2 through NM is connected to a respective compare circuit within compare unit 165A as is the output of reference monitor N1. The output of compare unit 165A is connected to control unit 170A Control unit 170A generates control signals supplied to respective well bias voltage regulators in adjustable voltage regulator unit 160A.

The number (n) of PFET monitor circuits is the number of different $V_t$ PFETs in the integrated circuit that are to be monitored and there is one monitor for each. The number (m) of NFET monitor circuits is the number of different $V_t$ NFETs in the integrated circuit that are to be monitored and there is one monitor for each. Reference monitor P1 monitors the performance of first (and reference) $V_t$ PFETs having a reference design threshold voltage of P1. Monitor P2 monitors the performance of second $V_t$ PFETs having a design threshold voltage of P2. Monitor circuit PN monitors the performance of $n^{th}$ $V_t$ PFETs having a design threshold voltage of PN. Reference monitor N1 monitors the performance of first (and reference) $V_t$ NFETs having a reference design threshold voltage of N1. Monitor N2 monitors the performance of second $V_t$ NFETs having a design threshold voltage of N2. Monitor NM monitors the performance of $m^{th}$ $V_t$ NFETs having a design threshold voltage of NM.

The value of n need not be the same as the value of m. Not every different $V_t$ NFET or different $V_t$ PFET on the integrated circuit need be monitored or connected to threshold voltage adjustment circuit 155A. In one example, adjustable voltage regulator unit 160A, PFET monitor circuits P1 through PN, NFET monitor circuits N1 through NM, compare unit 165A and control unit 170A are physically located on the integrated circuit chip. In one example, PFET monitor circuits P1 through PN, NFET monitor circuits N1 through NM, compare unit 165A and control unit 170A are physically located on the integrated circuit chip while adjustable voltage regulator unit 160A is physically located off chip.

Figure 3B:
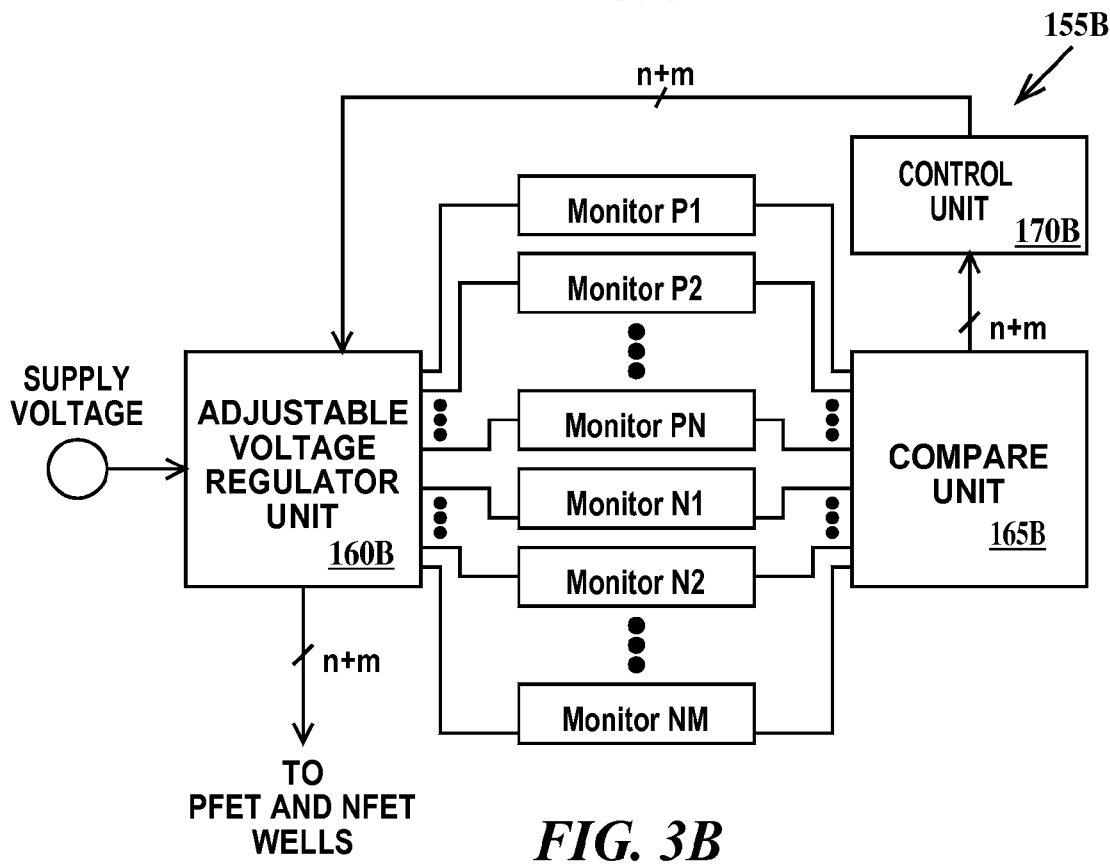
FIG. 3B is a schematic block circuit diagram of a circuit for threshold voltage control according to a second embodiment of the present invention.

FIG. 3B is a schematic block circuit diagram of a circuit for threshold voltage control according to a second embodiment of the present invention. FIG. 3B is similar to FIG. 3A except as noted. In FIG. 3B, a threshold voltage adjustment circuit 155B includes an adjustable voltage regulator unit 160B, a set of PFET monitor circuits P1 through PN, a set of NFET monitor circuits N1 through NM, a compare unit 165B and a control unit 170B. Adjustable voltage regulator unit 160B includes a separate N-well bias voltage regulator for each of the different $V_t$ PFETs (being monitored) and a separate P-well bias voltage regulator for each of the different $V_t$ NFETs (being monitored).

Each voltage regulator unit generates a well bias voltage that is distributed throughout the integrated circuit chip to respective $V_t$ devices as well as to respective monitors P1 through PN and N1 through NM. The output of each monitor P1 through PN and N1 through NM is connected to its respective compare circuit within compare unit 165B where it is compared to a performance target for that $V_t$ FET (instead of to a performance of a reference $V_t$ FET as in the first embodiment of the present invention). The output of compare unit 165B is connected to control unit 170B. Control unit 170B generates control signals supplied to respective well bias voltage regulators in adjustable voltage regulator unit 160B.

In one example, adjustable voltage regulator unit 160B, PFET monitor circuits P1 through PN, NFET monitor circuits N1 through NM, compare unit 165B and control unit 170B are physically located on the integrated circuit chip. In one example, PFET monitor circuits P1 through PN, NFET monitor circuits N1 through NM, compare unit 165B and control unit 170B are physically located on the integrated circuit chip while adjustable voltage regulator unit 160B is physically located off chip.

Figure 4A:
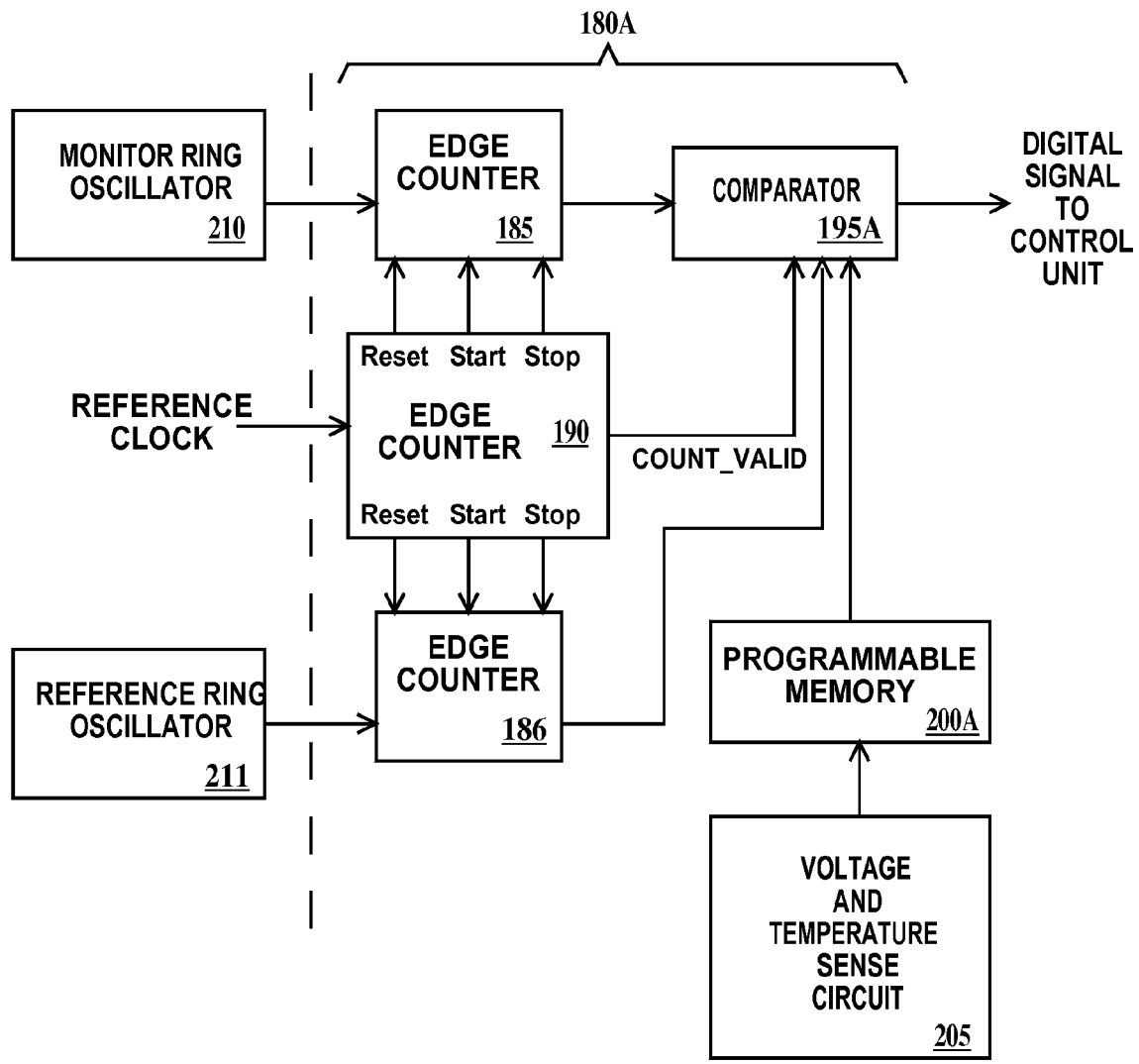
FIG. 4A is a block circuit diagram of an exemplary individual compare circuit of the compare unit of FIG. 3A.

FIG. 4A is a block circuit diagram of an exemplary individual compare circuit of compare unit 165A of FIG. 3A. In FIG. 4A, a compare circuit 180A includes a first edge counter 185, a second edge counter 190, a third edge counter 186, a comparator 195A, a programmable memory 200A and a voltage and temperature sense circuit 205. The output of a monitor ring oscillator 210 (monitoring an FET having a design $V_t$=P2 through PN or N2 through NM) is connected to the count input of first edge counter 185. Ring oscillators are well known in the art and comprise an odd number of sequential inverters with the feedback of the output to the input of the first inverter. The output of first edge counter 185 (a signal indicating the latest actual edge count) is connected to first compare input of a comparator 195A. The output of a reference monitor ring oscillator 211 (monitoring an FET having a design $V_t$=P1 or N1) is connected to the count input of third edge counter 186. A precise reference clock (external or internal to the integrated circuit chip) is connected to the count input of second edge counter 190. Second edge counter 190 supplies three control signals (reset, start and stop) to first and third edge counters 185 and 186, and a count valid signal to comparator 195A. A third compare input of comparator 195A is coupled to programmable memory 200A, which contains pre-determined target performance monitor ring oscillator 210 to reference monitor oscillators 211 ratios. Voltage and temperature sense circuit 205 is connected to programmable memory 200A and provides lookup values for selecting the appropriate target performance ratio based the temperature and the voltage supplied to the monitor ring oscillator.

While each compare circuit may include its own programmable memory and a voltage and temperature sense circuit, a common programmable memory may be shared between two or more of the compare circuits, a common voltage and temperature sense circuit may be shared between two or more of the compare circuits, or both a common programmable memory and a common voltage and temperature sense circuit may be shared between two or more of the compare circuits.

Monitor ring oscillator 210 and reference monitor ring oscillator 211 are exemplary monitor circuits. Monitor ring oscillator 210 represents any of PFET monitors P2 through PN or NFET monitors N2 through NM. If ring oscillator 210 represents PFET monitor P2, then the PFETs in the signal delay path of the ring oscillator are PFETs designed to have threshold voltage P2. If ring oscillator 210 represents PFET monitor PN, then the PFETs in the signal delay path of the ring oscillator are PFETs designed to have threshold voltage PN. If ring oscillator 210 represents NFET monitor N2, then the NFETs in the signal delay path of the ring oscillator is NFETs designed to have threshold voltage N2. If ring oscillator 210 represents NFET monitor NM, then the NFETs in the signal delay path of the ring oscillator are NFETs designed to have threshold voltage NM. If reference ring oscillator 211 represents PFET reference monitor P1, then the PFETs in the signal delay path of the ring oscillator are PFETs designed to have threshold voltage P1. If reference ring oscillator 211 represents NFET reference monitor circuit N1, then the NFETs in the signal delay path of the ring oscillator are NFETs designed to have threshold voltage N1. The delays through monitor ring oscillator 210 and reference ring oscillator 211 varies as a function of $V_t$ and well bias voltage (and also temperature and supply voltages as described infra).

In operation, second edge counter 190 issues a reset to first and third edge counters 185 and 186 to reset its count to zero. Then second edge counter 190 issues a start to first and third edge counters 185 and the first edge counter starts counting edges of the signal from monitor ring oscillator 210, second edge counter starts counting clock edges from the reference clock and third edge counter 186 starts counting edges of the signal from reference ring oscillator 211. When second edge counter 190 reaches a preset count value it issues a stop signal to first and second edge counters 185 and 186 and a count valid signal to comparator 195A. Comparator 195A compares the ratio of the actual count from first and second edge counters 185 and 186 to a value of a design ratio stored in programmable memory 200A and then issues a digital signal to control unit 170A (see FIG. 3A). The digital signal indicates the difference between the actual ratio and the design ratio. For example, if after 100 reference clock edges, the monitor actual count is 80 and the reference actual count is 20 then the ratio is 8:2. However, if the target ratio is 8:3, then the monitored FETs $V_t$ needs to be changed to give 30 actual counts.

Since the design count is influenced by the actual (as opposed to the designed) $V_{DD}/V_{SS}$ voltage levels (which affects the voltages on the source, drain and gates of FETs) and PFET/NFET temperature, programmable memory 200A includes a lookup table which comprises a two dimensional matrix of count ratios indexed in a first axis by voltage level increments and in a second axis by temperature increments. Voltage and temperature sensor circuit 205 measures the supply voltage to and temperature of the monitor circuit and passes the information to programmable memory 200A so a temperature and voltage compensated design ratio can be passed on to comparator 195A. There is some rounding error, dependent upon the granularity of matrix. Ratios of count values in the matrix may be obtained by simulation of the design, for example by using a software program such as SPICE (simulation program for integrated circuits emphasis). SPICE is a circuit simulator that was originally developed at the Electronics Research Laboratory of the University of California, Berkeley (1975) and now has many commercial variations. The user inputs circuit topology in spice netlist format. The simulator calculates and plots nodal voltages and currents in both time and frequency domains.

Figure 4B:
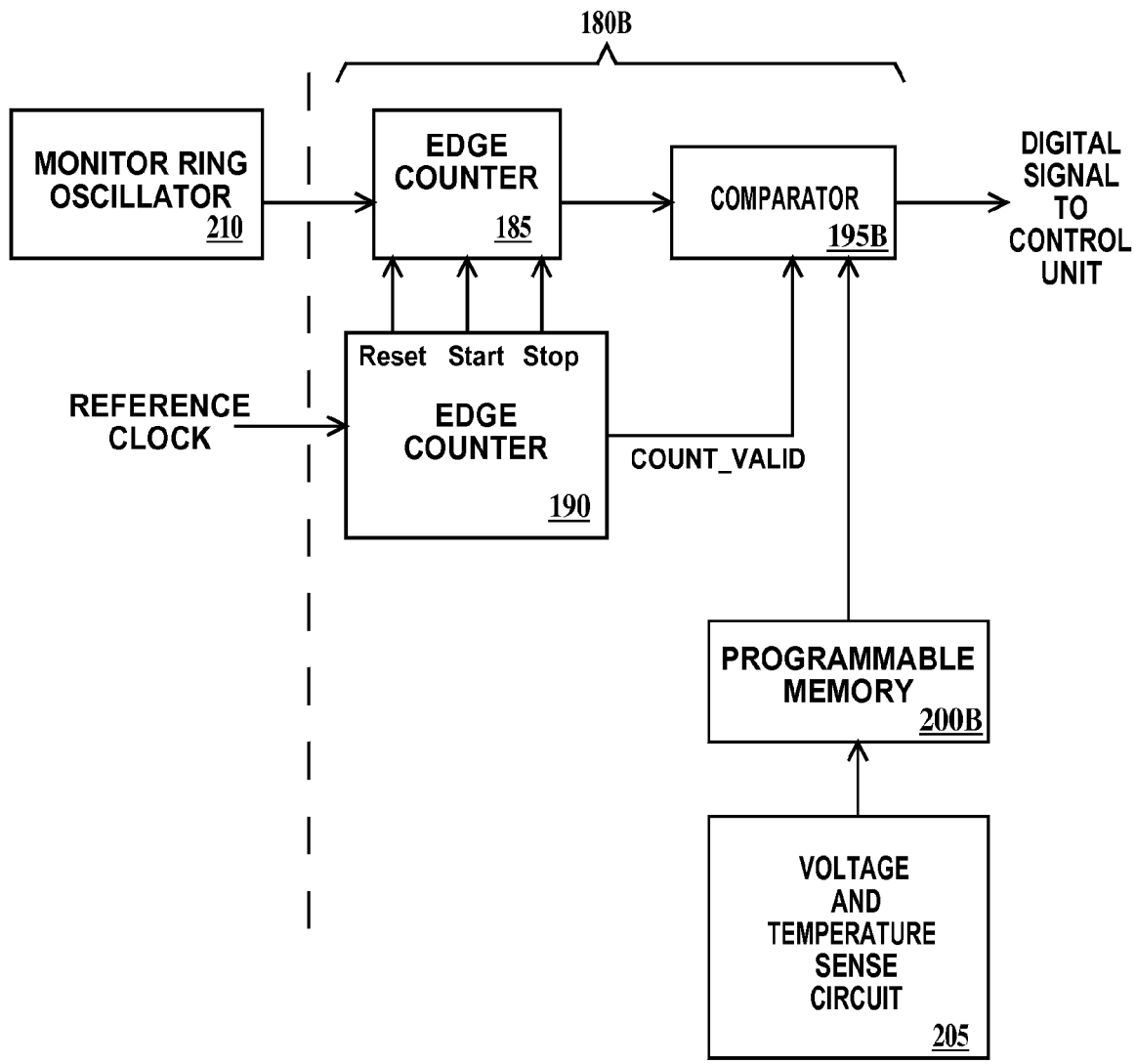
FIG. 4B is a block circuit diagram of an exemplary individual compare circuit of the compare unit of FIG. 3B.

FIG. 4B is a block circuit diagram of an exemplary individual compare circuit of compare unit 165B of FIG. 3B. In FIG. 4B, a compare circuit 180B includes first edge counter 185, second edge counter 190, a comparator 195B, a programmable memory 200B and voltage and temperature sense circuit 205. The output of a monitor ring oscillator 210 (monitoring an FET having a design $V_t$=P1 through PN or N1 through NM) is connected to the count input of first edge counter 185. The output of first edge counter 185 (a signal indicating the latest actual edge count) is connected to first compare input of a comparator 195B. A precise reference clock (external or internal to the integrated circuit chip) is connected to the count input of second edge counter 190. Second edge counter 190 supplies three control signals (reset, start and stop) to first edge counter 185 and a count valid signal to comparator 195B. A second compare input of comparator 195B is coupled to programmable memory 200B, which contains pre-determined target performance values for the monitor ring oscillator 210. Voltage and temperature sense circuit 205 is connected to programmable memory 200B and provides lookup values for selecting the appropriate performance target based the temperature of monitor ring oscillator 210 and the voltage supplied to the monitor ring oscillator.

While each compare circuit may include its own programmable memory and a voltage and temperature sense circuit, a common programmable memory may be shared between two or more of the compare circuits, a common voltage and temperature sense circuit may be shared between two or more of the compare circuits, or both a common programmable memory and a common voltage and temperature sense circuit may be shared between two or more of the compare circuits.

Monitor ring oscillator 210 has been described supra, however monitor ring oscillator 210 in FIG. 4B may represent any of PFET monitors P1 through PN or NFET monitors N1 through NM. If ring oscillator 210 represents PFET monitor circuit P1, then the PFETs in the signal delay path of the ring oscillator are PFETs designed to have threshold voltage P1. If ring oscillator 210 represents PFET monitor P2, then the PFETs in the signal delay path of the ring oscillator are PFETs designed to have threshold voltage P2. If ring oscillator 210 represents PFET monitor circuit PN, then the PFETs in the signal delay path of the ring oscillator are PFETs designed to have threshold voltage PN. If ring oscillator 210 represents NFET monitor circuit N1, then the NFETs in the signal delay path of the ring oscillator are NFETs designed to have threshold voltage N1. If ring oscillator 210 represents NFET monitor circuit N2, then the NFETs in the signal delay path of the ring oscillator are NFETs designed to have threshold voltage N2. If ring oscillator 210 represents NFET monitor circuit NM, then the NFETs in the signal delay path of the ring oscillator are NFETs designed to have threshold voltage NM. The delay through ring oscillator 210 varies as a function of $V_t$ and well bias voltage (and also temperature and supply voltages as described infra).

In operation, second edge counter 190 issues a reset to first edge counter 185 to reset its count to zero. Then second edge counter 190 issues a start to first edge counter 185 and the first edge counter starts counting edges of the signal from ring oscillator 210 and second edge counter starts counting clock edges from the reference clock. When second edge counter 190 reaches a preset count value it issues a stop signal to first edge counter 185 and a count valid signal to comparator 195B. Comparator 195B compares the value of the actual count from first edge counter 185 to a value of a design count stored in programmable memory 200B and then issues a digital signal to control unit 170B (see FIG. 3B). The digital signal indicates the difference between the actual edge count and the design edge count. For example, if after 100 reference clock edges, the actual count is 95 and the design count is 90 then the difference is 5 counts, indicating the monitored FETs $V_t$ needs to changed to give 90 actual counts.

Since the design count is influenced by the actual (as opposed to the designed) $V_{DD}/V_{SS}$ voltage levels (which affects the voltages on the source, drain and gates of FETs) and PFET/NFET temperature, programmable memory 200B includes a lookup table which comprises a two dimensional matrix of counts indexed in a first axis by voltage level increments and in a second axis by temperature increments. Voltage and temperature sensor circuit 205 measures the supply voltage to and temperature of the monitor circuit and passes the information to programmable memory 200B so a temperature and voltage compensated design count can be passed on to comparator 195B. There is some rounding error, dependent upon the granularity of matrix. Count values in the matrix may be obtained by simulation of the design, for example by using a software program such as SPICE described supra.

It should be understood that in FIGS. 4A and 4B, a ring oscillator is only one example of a circuit that may be used to monitor the performance of FETs and other monitor circuits and if appropriate, other types of compare circuits may be employed to compare the actual performance/switching speed of a PFET or and NFET to the designed performance/switching speed of the PFET or NFET.

Figure 5A:
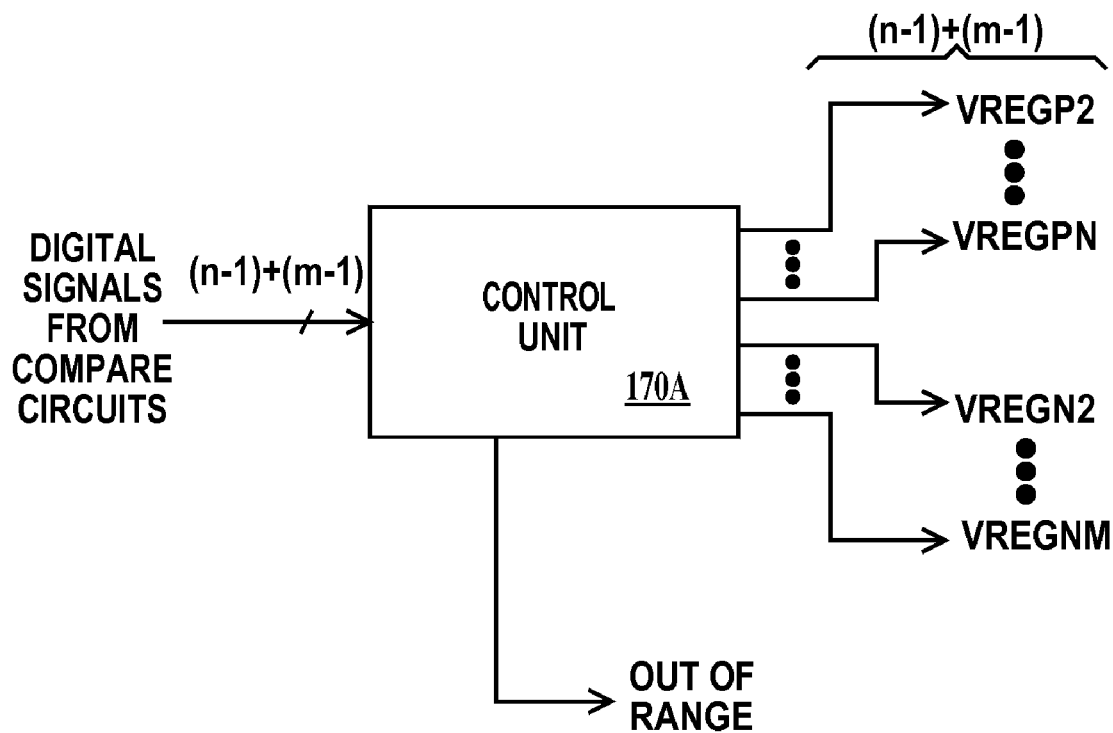
FIG. 5A is a diagram illustrating the control signal generated by the control unit of FIG. 3A according to the first embodiment of the present invention.

FIG. 5A is a diagram illustrating the control signal generated by control unit 170A of FIG. 3A according to the first embodiment of the present invention. In FIG. 5A, control unit 170A generates control signals VREGP2 to VREGPN and VREGN2 to VREGNM that are sent to respective voltage regulators in adjustable voltage regulator unit 160A. VREGP2 adjusts N-well bias voltage on PFETs designed to have threshold voltage P2. VREGPN adjusts N-well bias voltage on PFETs designed to have threshold voltage PN. VREGN2 adjusts P-well bias voltage on NFETs designed to have threshold voltage N2. VREGNM adjusts P-well bias voltage on NFETs designed to have threshold voltage NM. There is no VREGP1 or VREGN1 signal because PFETs designed to have threshold voltage P1 and NFETs designed to have threshold voltage N1 are reference devices.

Control unit 170A includes logic circuits that "calculate" or interface with on-chip stored software instructions to calculate an adjustment of well bias voltage. The adjustments reflect changes (if any) to be made in the actual threshold voltages of PFETs having design threshold voltages P2 through PN so that, when changed threshold voltages P2' through PN' are divided by the actual threshold voltage P1', the design threshold ratios discussed supra (if not the actual $V_t$ values) are restored to within an acceptable tolerance range. For example (P2'/P1')=(P2/P1). The adjustments reflect changes (if any) to be made in the actual threshold voltages of NFETs having design threshold voltages N2 through NM so that, when the changed threshold voltages N2' through NM' are divided by the actual threshold voltage N1', the design threshold ratios discussed supra (if not the actual $V_t$ values) are restored to within an acceptable tolerance range. For example (N2'/N1')=(N2/N1).

The signals VREGP2 to VREGPN and VREGN2 to VREGNM may be two-bit or multiple-bit words indicating an magnitude of increase, magnitude of decrease or no change in the well bias to be applied voltage regulators of adjustable voltage regulator unit 160A. Control unit 170A also generates an out of range signal, when it is not possible to adjust an individual voltage regulators output voltage any further.

Figure 5B:
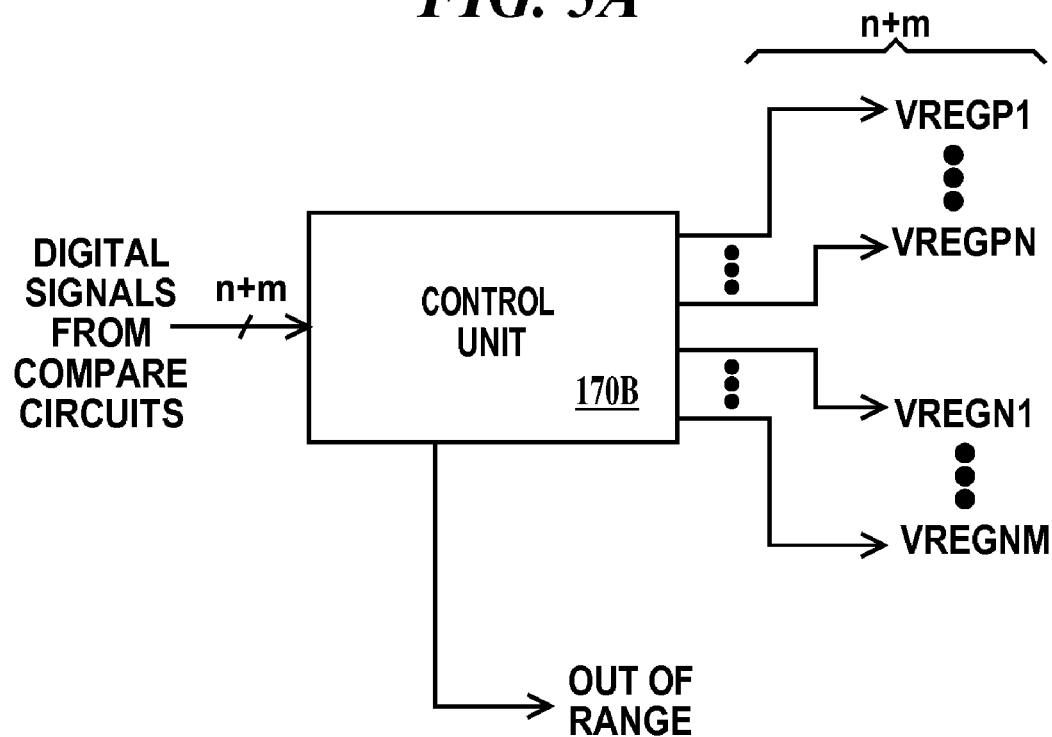
FIG. 5B is a diagram illustrating the control signal generated by the control unit of FIG. 3B according to the second embodiment of the present invention.

FIG. 5B is a diagram illustrating the control signal generated by control unit 170B of FIG. 3B according to the second embodiment of the present invention. In FIG. 5B, control unit 170B generates control signals VREGP1 to VREGPN and VREGN1 to VREGNM that are sent to respective voltage regulators in adjustable voltage regulator unit 160B. VREGP1 adjusts N-well bias voltage on PFETs designed to have threshold voltage P1. VREGPN adjusts N-well bias voltage on PFETs designed to have threshold voltage PN. VREGN1 adjusts P-well bias voltage on NFETs designed to have threshold voltage N1. VREGNM adjusts P-well bias voltage on NFETs designed to have threshold voltage NM.

Control unit 170B includes logic circuits that "calculate" or interface with on-chip stored software instructions to calculate an adjustment of well bias voltage. The adjustments reflect changes (if any) to be made in the actual threshold voltages of PFETs having design threshold voltages P1 through PN so that, when changed, the changed threshold voltages P1' through PN' should result in the performance (switching speeds) of PFETs having the design threshold voltages P1 through PN being the designed performance values or within an acceptable tolerance range of the designed performance values, although the actual threshold voltages may not be the designed values. The adjustments reflect changes (if any) to be made in the actual threshold voltages of NFETs having design threshold voltages N1 through NM so that, when changed, the changed threshold voltages N1' through NM' should result in the performance (switching speeds) of NFETS having design threshold voltages N1 through NM being the designed performance values or within an acceptable tolerance range of the designed performance values, although the actual threshold voltages may not be the designed values.

The signals VREGP1 to VREGPN and VREGN1 to VREGNM may be two-bit or multiple-bit words indicating a magnitude of increase, magnitude of decrease or no change in the well bias to be applied to voltage regulators of adjustable voltage regulator unit 160B. Control unit 170B also generates an out of range signal, when it is not possible to adjust an individual voltage regulators output voltage any further.

Figure 6:
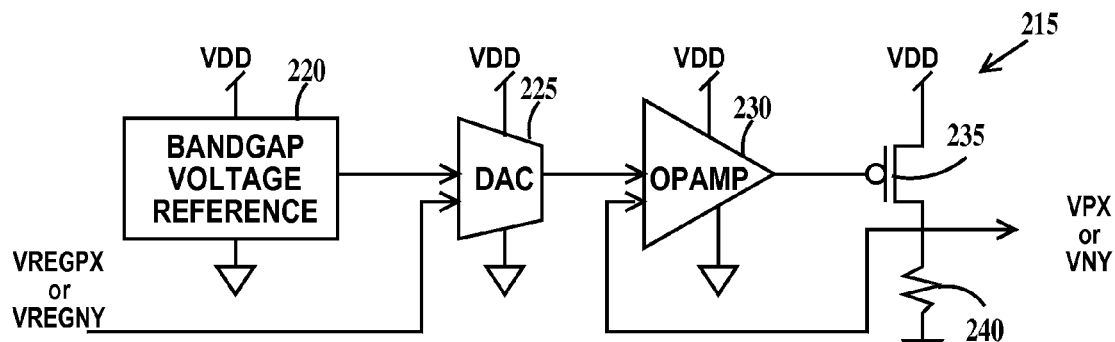
FIG. 6 is a schematic block diagram of a typical voltage regulator used to adjust well bias according to embodiments of the present invention.

FIG. 6 is a schematic block diagram of a typical voltage regulator used to adjust well bias according to embodiments of the present invention. In FIG. 6, a voltage regulator 215 includes a bandgap voltage reference 220, a digital to analog converter 225 an operational amplifier 230, a PFET 235 and a resistor 240. The output of bandgap voltage reference 220 is connected to an input of digital to analog converter 225 and controls signals VREGPX or VREGNY (where X=1 to N and Y=1 to M) are connected to control pins of the digital to analog converter. The output of digital to analog converter 225 is connected to a first input of operational amplifier 230 and the output of the operational amplifier is connected to the gate of PFET 235. The source of PFET 235 is connected to $V_{DD}$ and the drain of PFET 235 is connected to ground though resistor 240, to a second input of operational amplifier 230 and to the output of voltage regulator 215. The output voltage regulator 215 is connected to well PX or NY corresponding to the VREG signal applied to the input of the voltage regulator.

Figure 7A:
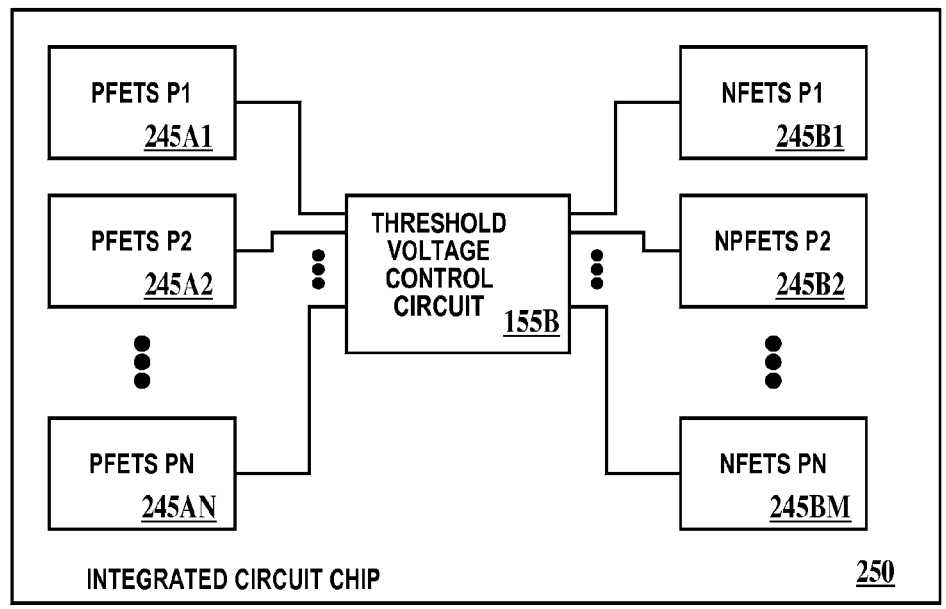
FIG. 7A is a diagram illustrating an exemplary floor plan of an integrated circuit chip according to the embodiments of the present invention.

FIG. 7A is a diagram illustrating an exemplary floor plan of an integrated circuit chip according to the embodiments of the present invention. While the different $V_t$ NFETs and PFETs may be placed anywhere on the integrated circuit chip this requires extensive wiring to distribute the well bias voltages. In one option, illustrated ion FIG. 7A, PFETs of the same $V_t$ are formed in common N wells 245A1 to 245AN and NFETs of the same $V_t$ are formed in common P wells 245B1 to 245BM on integrated circuit chip 250. This reduces the amount of well bias wiring from threshold voltage control circuit 155B. Notice that if threshold voltage control circuit 155B is replaced by threshold voltage control circuit 155A (see FIG. 3A) then there are no wires to P-well 245A1 and N-well 245B1 and in fact, those transistors need not be in a common well, but may be dispersed throughout the integrated circuit chip.

Figure 7B:
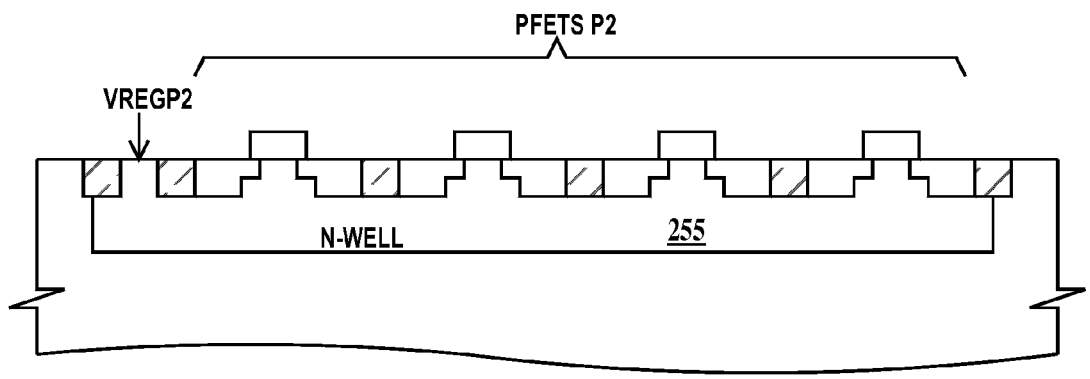
FIG. 7B is an exemplary cross-sectional diagram of multiple field effect transistors formed in a common well.

FIG. 7B is an exemplary cross-sectional diagram of multiple field effect transistors formed in a common well. In FIG. 7B, a group of PFETs P2 are formed in a common N-well 255, which is connected to VREGP2. The crosshatched regions indicate dielectric material.

Figure 8:
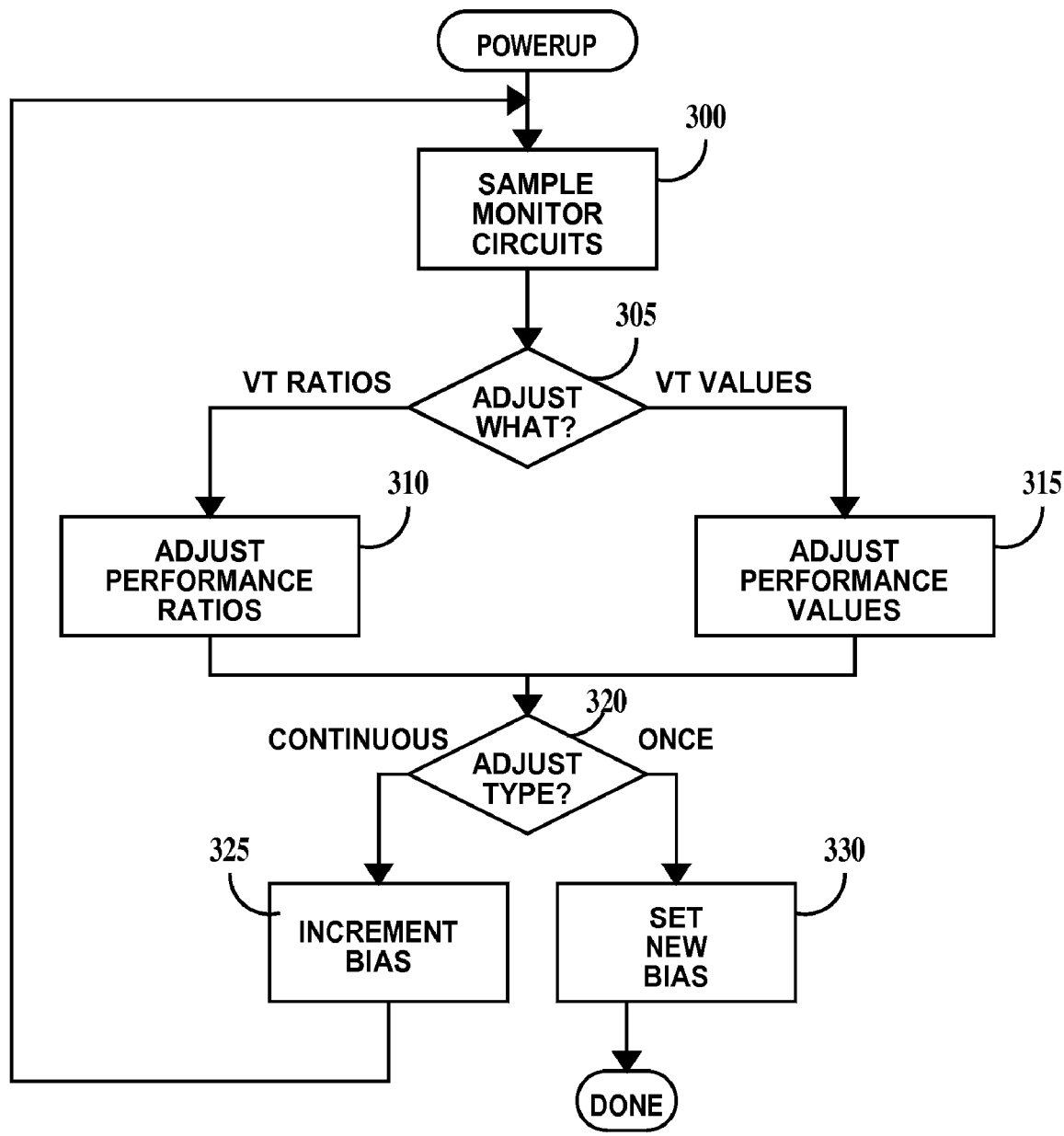
FIG. 8 is a flowchart of the methods of controlling threshold voltages of multiple-threshold voltage devices according to the embodiments of the present invention.

FIG. 8 is a flowchart of the methods of controlling threshold voltages of multiple-threshold voltage devices according to the embodiments of the present invention. In FIG. 8, after power-up, in step 300, the performance monitor circuits monitor the performance of the various $V_t$ NFETs and PFETs and in step 305 two options are presented. The first option is to adjust performance ratios of different $V_t$ PFETs/NFETs relative to a reference threshold PFET/NFET performance (the reference PFET/NFET is one of the different $V_t$ PFETs/NFETs) and the second option is to adjust the performance of all different $V_t$ PFETs/NFETs to design values. If the first option is chosen, the method proceeds to step 310, in which the first embodiment of the present invention described supra is employed. If the second option is chosen the method proceeds to step 315, in which the second embodiment of the present invention described supra is employed. After step 310 or 315 is performed two additional options are presented in step 320. The first additional option is to perform a one-time performance correction, and the second additional option is to perform continuous performance corrections. If the first additional option is chosen, the well bias voltages are adjusted by a single amount and the method terminates. Of course, the method using the first additional option may be repeated periodically. If the second additional option is chosen, the well bias voltages are adjusted incrementally by small amounts, and the monitors re-sampled and the well bias voltages adjusted incrementally in a continuous loop. If no adjustment is required (the monitor performance is already acceptable), the voltage regulators are not changed.

Figure 9:
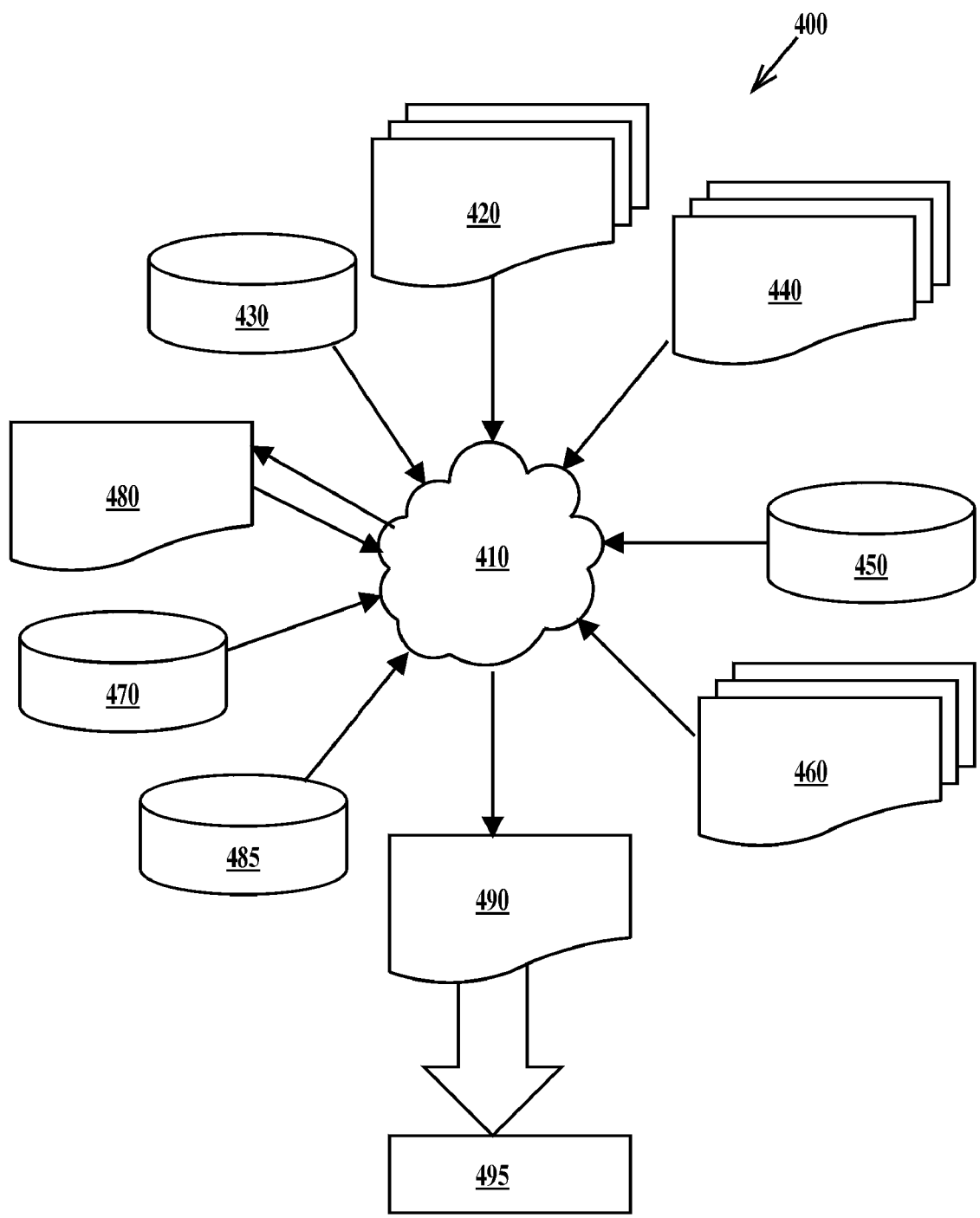
FIG. 9 is a flow diagram of a design process used in semiconductor design, manufacturing, and/or test.

FIG. 9 is a flow diagram of a design process used in semiconductor design, manufacturing, and/or test. In FIG. 9, a design flow 900 may vary depending on the type of IC being designed. For example, a design flow 400 for building an application specific IC (ASIC) may differ from a design flow 400 for designing a standard component. Design structure 420 is preferably an input to a design process 410 and may come from an IP provider, a core developer, or other design company or may be generated by the operator of the design flow, or from other sources. Design structure 420 comprises circuits 155A, 155B, 170A, 170B, 180A, 180B and 215 in the form of schematics or HDL, a hardware-description language (e.g., Verilog, VHDL, C, etc.). Design structure 420 may be contained on one or more machine-readable medium. For example, design structure 420 may be a text file or a graphical representation of circuit 100. Design process 410 preferably synthesizes (or translates) circuit 155A, 155B, 170A, 170B, 180A, 180B and 215 into a netlist 480, where netlist 480 is, for example, a list of wires, transistors, logic gates, control circuits, I/O, models, etc. that describes the connections to other elements and circuits in an integrated circuit design and recorded on at least one of machine readable medium. This may be an iterative process in which netlist 480 is re-synthesized one or more times depending on design specifications and parameters for the circuit.

Design process 410 may include using a variety of inputs; for example, inputs from library elements 430 which may house a set of commonly used elements, circuits, and devices, including models, layouts, and symbolic representations, for a given manufacturing technology (e.g., different technology nodes, 32 nm, 45 nm, 40 nm, etc.), design specifications 440, characterization data 450, verification data 460, design rules 470, and test data files 485 (which may include test patterns and other testing information). Design process 410 may further include, for example, standard circuit design processes such as timing analysis, verification, design rule checking, place and route operations, etc. One of ordinary skill in the art of integrated circuit design can appreciate the extent of possible electronic design automation tools and applications used in design process 410 without deviating from the scope and spirit of the invention. The design structure of the invention is not limited to any specific design flow.

Ultimately, design process 410 preferably translates circuits 155A, 155B, 170A, 170B, 180A, 180B and 215, along with the rest of the integrated circuit design (if applicable), into a final design structure 440 (e.g., information stored in a GDS storage medium). Final design structure 440 may comprise information such as, for example, test data files, design content files, manufacturing data, layout parameters, wires, levels of metal, vias, shapes, test data, data for routing through the manufacturing line, and any other data required by a semiconductor manufacturer to produce circuit 100. Final design structure 440 may then proceed to a stage 445 where, for example, final design structure 440: proceeds to tape-out, is released to manufacturing, is sent to another design house or is sent back to the customer.

Thus, the embodiments of the present invention provide methods, circuits and design structures for maintaining the design values and/or relationships between the different threshold voltage values of multi-threshold voltage devices.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A design structure comprising:
design data embodied in a machine-readable medium, said design data useable by a computer based system for designing, manufacturing, or testing an integrated circuit, said integrated circuit comprising:
a first set of field effect transistors (FETs) having a designed same first threshold voltage and a second set of FETs having a designed same second threshold voltage, said first threshold voltage different from said second threshold voltage;
a first monitor circuit containing at least one FET of said first set of FETs and configured to generate a first output signal based on a first switching speed of said at least one FET of said first FETs;
a second monitor circuit containing at least one FET of said second set of FETs and configured to generate a second output signal based on a second switching speed of said at least one FET of said second FETs;
a compare circuit configured to generate a compare signal based on said first output signal and said second output signal, said compare circuit including a first edge counter connected between said first monitor circuit and a first comparator, a second edge counter connected between a reference clock and said first comparator and third edge counter connected between said second monitor circuit and said comparator;
a control unit responsive to said compare signal and configured to generate a control signal based on said compare signal;
an adjustable voltage regulator responsive to said control signal and configured to supply a bias voltage to wells of FETs of said second set of FETs, the value of said bias voltage based on said control signal; and
a memory device containing a ratio of said first performance specifications of said first monitor circuit to a second performance specification of said second monitor circuit, said memory device coupled to said comparator.

2. The design structure of claim 1, wherein said control unit is adapted to generate said control signal such that a ratio of a performance of FETs of said first set of FETs and a performance of FETs of said second set of FETs is equal to a performance ratio specification or is within an acceptable tolerance range of said performance ratio specification.

3. A design structure comprising:
design data embodied in a machine-readable medium, said design data useable by a computer based system for designing, manufacturing, or testing an integrated circuit, said integrated circuit comprising:
a first set of field effect transistors (FETs) having a designed same first threshold voltage and a second set of FETs having a designed same second threshold voltage, said first threshold voltage different from said second threshold voltage;
a first monitor circuit containing at least one FET of said first set of FETs and configured to generate a first output signal based on a first switching speed of said at least one FET of said first FETs;
a second monitor circuit containing at least one FET of said second set of FETs and configured to generate a second output signal based on a second switching speed of said at least one FET of said second FETs;
a compare circuit configured to generate a compare signal based on said first output signal and said second output signal, said compare circuit including a first edge counter connected between said first monitor circuit and a first comparator and a second edge counter connected between a reference clock and said first comparator;
a control unit responsive to said compare signal and configured to generate a control signal based on said compare signal;
an adjustable voltage regulator responsive to said control signal and configured to supply a bias voltage to wells of FETs of said second set of FETs, the value of said bias voltage based on said control signal;

an additional compare circuit including a third edge counter connected between said second monitor circuit and a second comparator and a fourth edge counter connected between said reference clock and said second comparator; and a first memory device containing a first performance specification for said first monitor circuit coupled to said first comparator and a second memory device containing a second performance specification for said second monitor circuit coupled to said second comparator.

4. The design structure of claim 3, wherein said control unit is adapted to generate an additional control signal based on an additional compare signal generated by said additional compare circuit, and further including:

an additional voltage regulator, said additional voltage regulator adapted to supply an additional bias voltage to wells of FETs of said first set of FETs, the value of said additional bias voltage based on said additional control signal.

5. The design structure of claim 4, wherein said control unit is adapted to generate said control signal and said additional control signal such that a performance of FETs of said first set of FETs is equal to a first performance specification or is within an acceptable tolerance range of said first performance specification and such that a performance of FETs of said second set of FETs is equal to a second performance specification or is within an acceptable tolerance range of said second performance specification.

6. The design structure of claim 3, further including:

means for adjusting expected values of said performance measurements of said first and second monitor circuits based on a temperature of and supply voltage to said first and second monitor circuits.

7. The design structure of claim 3, wherein the design structure comprises a netlist, which describes the circuit.

8. The design structure of claim 3, wherein the design structure resides on a GDS storage medium.

9. The design structure of claim 3, wherein the design structure includes at least one of test data files, characterization data, verification data, or design specifications.

10. The design structure of claim 1, further including:

means for adjusting expected values of said performance measurements of said first and second monitor circuits based on a temperature of and supply voltage to said first and second monitor circuits.

11. The design structure of claim 1, wherein the design structure comprises a netlist, which describes the circuit.

12. The design structure of claim 1, wherein the design structure resides on a GDS storage medium.

13. The design structure of claim 1, wherein the design structure includes at least one of test data files, characterization data, verification data, or design specifications.

14. A design structure comprising:

design data encoded in a hardware description language (HDL) on a machine-readable data storage medium, said design data comprising elements that when processed in a computer-aided design system generate a machine executable representation of an integrated circuit, said integrated circuit comprising:

a first set of field effect transistors (FETs) having a designed same first threshold voltage and a second set of FETs having a designed same second threshold voltage, said first threshold voltage different from said second threshold voltage;

a first monitor circuit containing at least one FET of said first set of FETs and configured to generate a first output signal based on a first switching speed of said at least one FET of said first FETs;

a second monitor circuit containing at least one FET of said second set of FETs and configured to generate a second output signal based on a second switching speed of said at least one FET of said second FETs;

a compare circuit configured to generate a compare signal based on said first output signal and said second output signal, said compare circuit including a first edge counter connected between said first monitor circuit and a comparator and a second edge counter connected between a reference clock and said comparator;

a control unit responsive to said compare signal and configured to generate a control signal based on said compare signal; and an adjustable voltage regulator responsive to said control signal and configured to supply a bias voltage to wells of FETs of said second set of FETs, the value of said bias voltage based on said control signal.

15. The design structure of claim 14, further including:

an third edge counter connected between said second monitor circuit and said comparator.

16. The design structure of claim 14, further including:

a memory device containing a ratio of said first performance specifications of said first monitor circuit to a second performance specification of said second monitor circuit, said memory device coupled to said comparator.

* * * * *